US010206031B2

(12) United States Patent
Dickins et al.

(10) Patent No.: US 10,206,031 B2
(45) Date of Patent: Feb. 12, 2019

(54) SWITCHING TO A SECOND AUDIO INTERFACE BETWEEN A COMPUTER APPARATUS AND AN AUDIO APPARATUS

(71) Applicant: Dolby Laboratories Licensing Corporation, San Francisco, CA (US)

(72) Inventors: Glenn N. Dickins, Como (AU); Gopal Erinjippurath, San Francisco, CA (US); Gary Spittle, Hillsborough, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/094,040

(22) Filed: Apr. 8, 2016

(65) Prior Publication Data
US 2016/0302004 A1    Oct. 13, 2016

Related U.S. Application Data

(60) Provisional application No. 62/145,019, filed on Apr. 9, 2015.

(51) Int. Cl.
*H04R 3/00* (2006.01)
*H04R 3/12* (2006.01)
(Continued)

(52) U.S. Cl.
CPC .............. *H04R 3/00* (2013.01); *H04R 3/12* (2013.01); *G06F 13/10* (2013.01);
(Continued)

(58) Field of Classification Search
CPC ... H04R 3/00; H04R 1/08; H04R 1/24; H04R 2420/01; H04R 5/033; H04R 1/1041;
(Continued)

(56) References Cited

U.S. PATENT DOCUMENTS 7,010,332 B1    3/2006    Irvin
7,499,686 B2    3/2009    Sinclair
(Continued)

FOREIGN PATENT DOCUMENTS

EP    2530599    12/2012
WO    2008/090400    7/2008
(Continued)

OTHER PUBLICATIONS

Kim, Yong Guk et al "Ultrasonic Sensor-Based Personalized Multichannel Audio Rendering for Multiview Broadcasting Services" Hindawi Publishing Corporation, vol. 2013, Article ID 417574, 9 pages, 2013.
(Continued)

*Primary Examiner* — Davetta W Goins
*Assistant Examiner* — Kuassi Ganmavo (57) ABSTRACT

An audio apparatus is configured to switch, when there exists a first audio interface between the audio apparatus and a computer apparatus, to using a second audio interface between the audio apparatus and the computer apparatus, the second audio interface being different from the first audio interface. The switching comprises: receiving, via the first audio interface, combined audio data and non-audio data, the non-audio data comprising a request to switch to using the second audio interface; obtaining the request from the data; and, in response to obtaining the request, transmitting to the computer apparatus a confirmation of switching to using the second audio interface. The audio apparatus and the computer apparatus are described and claimed.

20 Claims, 4 Drawing Sheets

(51) Int. Cl.
  *H04M 1/60* (2006.01)
  *H04R 1/24* (2006.01)
  *H04R 1/10* (2006.01)
  *H04M 1/05* (2006.01)
  *H04R 5/033* (2006.01)
  *H04R 1/08* (2006.01)
  *G06F 13/10* (2006.01)

(52) U.S. Cl.
  CPC ..... *G09G 2360/06* (2013.01); *H03G 2201/40* (2013.01); *H04M 1/05* (2013.01); *H04M 1/6066* (2013.01); *H04R 1/08* (2013.01); *H04R 1/1041* (2013.01); *H04R 1/24* (2013.01); *H04R 5/033* (2013.01); *H04R 2227/003* (2013.01); *H04R 2420/01* (2013.01); *H04R 2420/07* (2013.01)

(58) Field of Classification Search
  CPC ............ H04R 2420/07; H04R 3/12; H04R 2227/003; H04M 1/05; H03G 2201/40; G09G 2360/06; G09G 2330/021; G06F 13/10
  See application file for complete search history.

(56) References Cited

U.S. PATENT DOCUMENTS

| | | | |
|---|---|---|---|
| 8,199,942 B2 | 6/2012 | Mao | |
| 8,209,441 B1* | 6/2012 | Brockway | G06F 3/162 379/32.01 |
| 8,218,397 B2 | 7/2012 | Chan | |
| 8,498,426 B2 | 7/2013 | Bonanno | |
| 8,600,085 B2 | 12/2013 | Chen | |
| 8,666,082 B2 | 3/2014 | Dreifus | |
| 8,781,147 B1 | 7/2014 | Giuroiu | |
| 2003/0095524 A1* | 5/2003 | Stephens | H04L 29/06 370/338 |
| 2004/0160993 A1 | 8/2004 | Ganton | |
| 2006/0045304 A1 | 3/2006 | Lee | |
| 2007/0242061 A1* | 10/2007 | Rhoten | G06F 3/1431 345/204 |
| 2008/0032629 A1* | 2/2008 | Wang | H04M 1/7253 455/41.2 |
| 2008/0205664 A1* | 8/2008 | Kim | H04M 1/6066 381/77 |
| 2008/0208377 A1* | 8/2008 | Li | G06F 3/165 700/94 |
| 2009/0034748 A1 | 2/2009 | Sibbald | |
| 2009/0063710 A1* | 3/2009 | Sekine | H04N 1/00236 710/1 |
| 2009/0063718 A1* | 3/2009 | Sekine | G06F 9/4411 710/8 |
| 2009/0252355 A1* | 10/2009 | Mao | H04R 1/1083 381/309 |
| 2009/0305633 A1* | 12/2009 | Warsta | H04W 8/245 455/41.2 |
| 2010/0128888 A1* | 5/2010 | Junge | H04R 5/033 381/74 |
| 2010/0150276 A1 | 6/2010 | Yew | |
| 2010/0151788 A1* | 6/2010 | Rahman | H04M 1/6066 455/41.2 |
| 2011/0184541 A1 | 7/2011 | Huang | |
| 2011/0196519 A1 | 8/2011 | Khoury | |
| 2012/0020492 A1 | 1/2012 | Brown | |
| 2012/0093325 A1* | 4/2012 | Tang | H04R 3/12 381/28 |
| 2012/0099738 A1 | 4/2012 | Lee | |
| 2012/0135686 A1* | 5/2012 | Yang | H04M 1/6066 455/41.2 |
| 2012/0244812 A1 | 9/2012 | Rosener | |
| 2012/0259612 A1* | 10/2012 | Lyons | G06F 3/162 703/21 |
| 2013/0077800 A1* | 3/2013 | Pan | H04S 3/004 381/74 |
| 2013/0157631 A1* | 6/2013 | Wang | H04M 1/6066 455/415 |
| 2013/0279724 A1 | 10/2013 | Stafford | |
| 2014/0016803 A1 | 1/2014 | Puskarich | |
| 2014/0029762 A1 | 1/2014 | Xie | |
| 2014/0105312 A1* | 4/2014 | Bennett | H04L 27/12 375/257 |
| 2014/0105432 A1* | 4/2014 | Jing | H04R 5/04 381/309 |
| 2014/0121796 A1* | 5/2014 | Tu | G06F 3/162 700/94 |
| 2014/0146979 A1 | 5/2014 | Puskarich | |
| 2015/0032446 A1 | 1/2015 | Dickins | |
| 2015/0248889 A1 | 9/2015 | Dickins | |
| 2015/0356978 A1 | 12/2015 | Dickins | |
| 2016/0041808 A1* | 2/2016 | Pelland | G06F 3/162 381/123 |

FOREIGN PATENT DOCUMENTS

| | | |
|---|---|---|
| WO | 2012/173669 | 12/2012 |
| WO | 2014/100573 | 6/2014 |

OTHER PUBLICATIONS

Haiping, Zhao et al "Active Noise Control with Double Channels Based on Virtual Sensors" Audio Engineering, v 34, No. 11, pp. 79-87, 2010.

You, S. et al "Rendering Five-Channel Audio on Headsets" IEEE Proc. of the Ninth International Symposium on Consumer Electronics, pp. 25-30, 2005.

* cited by examiner

SWITCHING TO A SECOND AUDIO INTERFACE BETWEEN A COMPUTER APPARATUS AND AN AUDIO APPARATUS

CROSS-REFERENCE TO RELATED APPLICATIONS

The present application claims the benefit of priority from U.S. Provisional Patent Application No. 62/145,019, filed Apr. 9, 2015, which is incorporated herein by reference in its entirety.

TECHNICAL FIELD

The present invention relates generally to audio apparatus and system, and more particularly to the switching from a first to a second audio interface between a computer apparatus and an audio apparatus or system.

BACKGROUND

It is common to connect an audio apparatus to a computer apparatus. For example, a user may connect stereo loudspeakers to his laptop computer for playing back music or the soundtrack of a movie. As another example, a user may connect an audio headset, comprising left and right speakers and a microphone, to his laptop computer in order to make or receive a call via a Voice-over-Internet Protocol (VoIP) based telecommunications application.

An important design factor for these and other audio apparatus is ease of installation. Users have grown accustomed to and desire the convenience of "plug-and-play" type installation. Installing a device driver from a CD-ROM appears to be a thing of the past.

A significant drawback of the desire for plug-and-play type installation of audio apparatus is that it discourages non-standard configuration of the audio apparatus. In particular, a designer typically will choose to use a standard audio interface for the communication between his new audio apparatus and audio applications running on a computer apparatus, if interoperability and easy installation are important. In which case, the functionality of this new audio apparatus will be limited to the functionality made available by the standard audio interface. If the designer wanted to implement a bespoke (e.g., higher performance) audio interface and functionality, e.g. to enable 7.1 channel surround sound rendering, then he would need to provide a suitable device driver for installation on a computer apparatus to be used with the audio apparatus, which is contrary to users' desire for "plug-and-play" type functionality. And probably the audio apparatus then would not function correctly on a computer apparatus which had not installed the device driver. Thus there exists a trade-off between functionality, on the one hand, and interoperability and easy installation on the other hand.

SUMMARY

The present document addresses the drawback noted above. That is, the present disclosure is concerned with enabling an audio apparatus or system to exhibit non-standard functionality and/or to have a non-standard interface, while maintaining a high degree of interoperability and ease of installation.

In a first class of embodiments there is a computer apparatus configured to switch, when there exists a first audio interface between the computer apparatus and a connected audio apparatus, to using a second audio interface for communication between the computer apparatus and the audio apparatus, the second audio interface being different from the first audio interface. This switching may comprise: obtaining audio data to be transmitted to the audio apparatus; combining non-audio data with the audio data, the non-audio data comprising a request to switch to using the second audio interface; transmitting the combined audio data and non-audio data to the audio apparatus using the first audio interface; and waiting for a confirmation from the audio apparatus that it has switched to using the second audio interface.

In various embodiments, the computer apparatus may be configured to combine the non-audio data with the audio data by modulating the non-audio data onto a carrier signal and adding the modulated carrier signal to the audio data.

In various embodiments, the computer apparatus may be configured to use the second audio interface to communicate with the audio apparatus after, and as a result of, receiving the confirmation from the audio apparatus.

In various embodiments, the computer apparatus may be configured to use the second audio interface to access or control additional functionality of the audio apparatus, the additional functionality being unavailable via the first audio interface.

In various embodiments, the computer apparatus may be configured to use the first audio interface to communicate with the audio apparatus if the confirmation from the audio apparatus is not received within a given period of time.

In a first class of embodiments there is an audio apparatus configured to switch, when there exists a first audio interface between the audio apparatus and a computer apparatus, to using a second audio interface for communication between the audio apparatus and the computer apparatus, the second audio interface being different from the first audio interface. The switching may comprise: receiving, via the first audio interface, combined audio data and non-audio data, the non-audio data comprising a request to switch to using the second audio interface; obtaining the request from the data; and in response to obtaining the request, transmitting to the computer apparatus a confirmation of switching to using the second audio interface.

In various embodiments, the audio apparatus may be configured to obtain the data by demodulation of a modulated carrier signal combined with the audio data.

In various embodiments, the audio apparatus may be configured to send the confirmation by at least: obtaining audio data to be transmitted to the computer apparatus; combining non-audio data with the audio data, the non-audio data comprising the confirmation; and transmitting the combined audio data and non-audio data to the computer apparatus using the first audio interface.

In various embodiments, the audio apparatus may be further configured to use the second audio interface to communicate with the computer apparatus after, and as a result of, obtaining the request.

In various embodiments, the audio apparatus may be further configured switch from a first mode of operation to a second mode of operation, after, and as a result of, obtaining the request, the second mode of operation comprising additional functionality as compared with the first mode of operation.

In various embodiments, two or more capture channels may be defined for the second audio interface, wherein each of the capture channels is an audio channel for carrying audio data from the audio apparatus to the computer apparatus. The audio apparatus may comprise a first microphone and a second microphone, and may be configured to: transmit an audio signal captured by the first microphone to the computer apparatus via a first one of the capture channels; and transmit an audio signal captured by the second microphone to the computer apparatus via a second one of the capture channels. The first one of the microphones may be arranged to capture an audio signal representative mainly of a user's voice. The second one of the microphones may be arranged to capture an audio signal representative mainly of ambient noise.

In various embodiments, three or more render channels may be defined for the second audio interface, wherein each of the render channels is an audio channel for carrying audio data from the computer apparatus to the audio apparatus.

In various embodiments, the audio apparatus may comprise a first acoustic actuator, a second acoustic actuator and a third acoustic actuator. The audio apparatus may be further configured to: use the first acoustic actuator to render an audio signal received from the computer apparatus via a first one of the render channels; and use the second acoustic actuator to render an audio signal received from the computer apparatus via a second one of the render channels; and use the third acoustic actuator to render an audio signal received from the computer apparatus via a third one of the render channels. The first and second acoustic actuators may be left and right loudspeakers, respectively. The third acoustic actuators may be configured to render a low frequency audio signal.

In a third class of embodiments, there is an audio apparatus comprising a controller, the controller being configured to: receive non-audio data; generate purported audio data representative of the received non-audio data; and transmit the purported audio data to a computer apparatus over an audio channel.

In various embodiments, the controller may be configured to generate the purported audio data by arranging the received non-audio data in a format suitable for transmission over the audio channel.

In various embodiments, the controller may be configured to generate the purported audio data by at least modulating the received non-audio data onto a carrier signal and representing the modulated carrier signal by the purported audio data.

In various embodiments, the controller may be the controller is further configured to: receive audio data; and transmit the received audio data, along with the purported audio data, to the computer apparatus over the audio channel or another audio channel.

In various embodiments, the controller may be configured to transmit the received audio data, along with the purported audio data, to the computer apparatus over the audio channel by at least time interleaving the received audio data and the purported audio data.

In various embodiments, the controller may be configured to transmit the received audio data, along with the purported audio data, to the computer apparatus over the audio channel by summing the received audio data and the purported audio data.

In various embodiments, the controller may be configured to receive the non-audio data from one or more sensors associated with the audio apparatus.

In various embodiments, the controller may be configured to receive the audio data from a microphone associated with the audio apparatus.

The present disclosure also provides a non-transitory computer readable storage medium comprising software instructions which, when executed by one or more processors of a computer apparatus, or of an audio apparatus, cause the computer apparatus, or the audio apparatus, to be configured in accordance with any of the embodiments disclosed herein.

The present disclosure also provides a teleconference system comprising a plurality of interconnected telephone endpoints, at least one of the telephone endpoints comprising the computer apparatus of any one of the embodiments disclosed herein. In such a teleconference system, wherein said at least one of the telephone endpoints may comprises an audio apparatus in accordance with any of the embodiments disclosed herein, connected to said computer apparatus.

NOTATION AND NOMENCLATURE

The term "audio signal" is used herein to refer to a time-varying representation of sound.

The term "audio data" is used herein to refer to data representative of an audio signal.

The term "purported audio data" is used herein to refer to data of a format which is substantially the same as that of audio data, which is not representative of an audio signal.

The term "audio channel" is used herein to refer to a logical pathway which allows one or more audio signals to be carried from one logical endpoint to one or more other logical endpoints.

The term "audio interface" is used herein to refer to a software interface which determines how an application running on a first device or apparatus shall send one or more audio signals to a second device or apparatus, and/or how the application running on the first device or apparatus is to receive one or more audio signals from the second device or apparatus. Typically, at least one audio channel will be defined for a given audio interface.

The term "render" is used herein to refer to the process of converting one or more audio signals to sound using one or more loudspeakers or similar acoustic actuators.

The term "capture" is used herein to refer to the process of converting sound into one or more audio signals using a microphone or similar transducer.

DESCRIPTION OF EMBODIMENTS

Embodiments of the present disclosure will now be described by way of example, and not by way of limitation, with reference to the accompanying drawings, in which like reference numerals refer to like elements.

Figure 1:
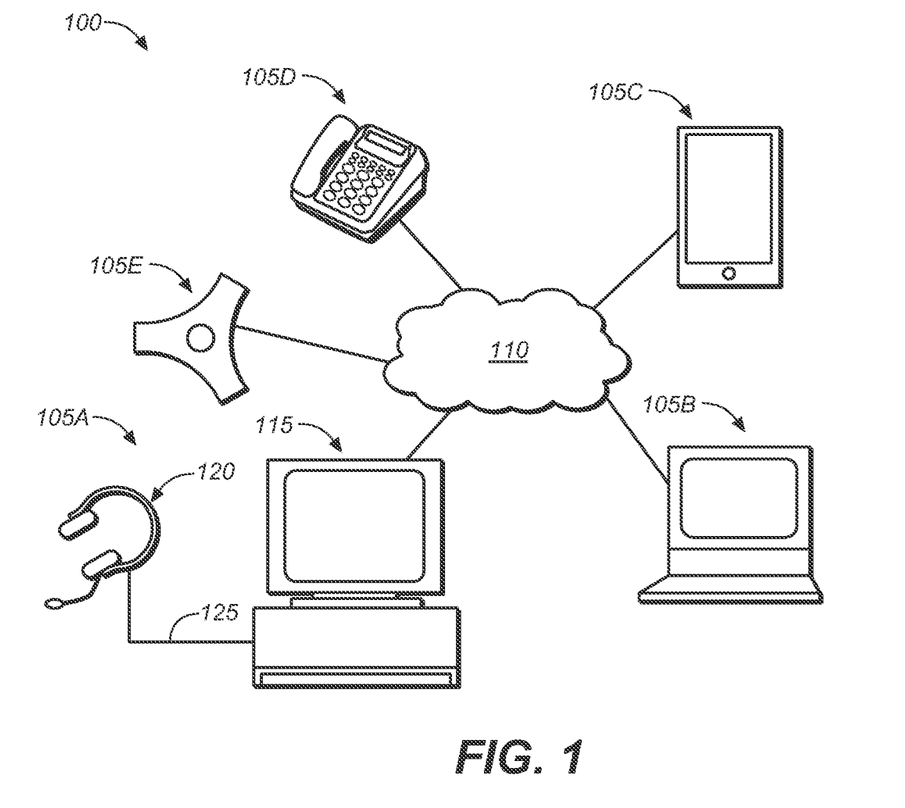
FIG. 1 provides a schematic overview of a teleconference system according to an embodiment.

As shown in FIG. 1, a teleconference system 100 according to an embodiment comprises a plurality of telephone endpoints 105A-E connected to each other via a network 110.

The plurality of telephone endpoints 105A-E comprises a novel telephone endpoint 105A; a conventional laptop computer 105B, comprising a voice over Internet Protocol (VoIP) telephony application; a conventional smartphone 105C; a conventional telephone 105; and a conventional conference phone 105E. Other suitable telephone endpoints, which fall within the scope of the accompanying claims, will be readily appreciated by those skilled in the art.

The network 110 is an Internet Protocol (IP) based network comprising the Internet. Communications between the telephone endpoints 105A-E comprise IP based communications. Telephone endpoints such as the smartphone 105C, the conventional telephone 105D and the conventional conference phone 105E may connect to the network 110 via conventional connections, such as a plain old telephone service (POTS) connection, an Integrated Services Digital Network (ISDN) connection, a cellular network connection, or the like, in a conventional manner (well known in VoIP communications).

The novel telephone endpoint 105A comprises a computer apparatus 115 connected to an audio apparatus 120. The connection 125 between the computer apparatus 115 and the audio apparatus 120 is a wired connection, specifically a Universal Serial Bus (USB) connection; other suitable connections, which fall within the scope of the accompanying claims, include different types of wired connection and also various types of wireless connection, e.g. a Bluetooth connection.

Figure 2:
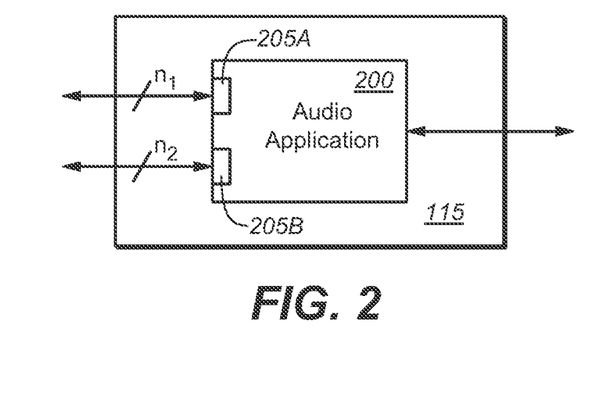
FIG. 2 is a schematic diagram showing some of the components of the computer apparatus (115) shown in FIG. 1.

Referring now to FIG. 2, the computer apparatus 115 comprises a conventional desktop computer configured to execute a novel audio application 200. Other suitable computer apparatus, which fall within the scope of the accompanying claims, include laptop computers, tablet computers, smartphones and the like, as will be readily appreciated by those skilled in the art.

A novel aspect of the audio application 200 is that it can communicate with the audio apparatus 120 via a first audio interface 205A or via a second audio interface 205B. For convenience and simplicity of illustration, the first and second audio interfaces 205A and 205B are shown side-by-side in FIG. 2; this should not be interpreted as imposing any limitation on the way in which the first and second audio interfaces 205A and 205B are to be implemented.

The first audio interface 205A is a conventional audio interface, which allows the audio application 200 to communicate with conventional audio apparatus as well as the novel audio apparatus 120 (described in more detail below). The first audio interface 205A is established, e.g. when the audio apparatus is first connected to the computer apparatus, using a standard procedure. The standard procedure will depend on the type of audio apparatus and/or the type of connection between the computer apparatus and the audio apparatus.

Figure 3A:
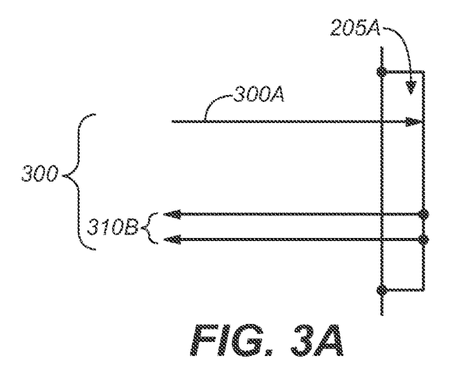
FIGS. 3A and B are schematic diagrams showing the channels of a first interface and a second interface, respectively, from the perspective of the computer apparatus shown in FIGS. 1 and 2.

Referring now to FIG. 3A, a first plurality of audio channels 300 is defined for the first audio interface 205A. The first plurality of audio channels 300 comprises one capture audio channel 300A and two render audio channels 300B. The capture audio channel 300A is suitable for carrying an audio signal from the audio apparatus 120 to the computer apparatus 115; in this embodiment, it is a monophonic (aka monaural) audio channel. Each of the render audio channels 300B is suitable for carrying an audio signal from the computer apparatus 115 to the audio apparatus 120; in this embodiment, they are stereophonic audio channels.

Figure 3B:
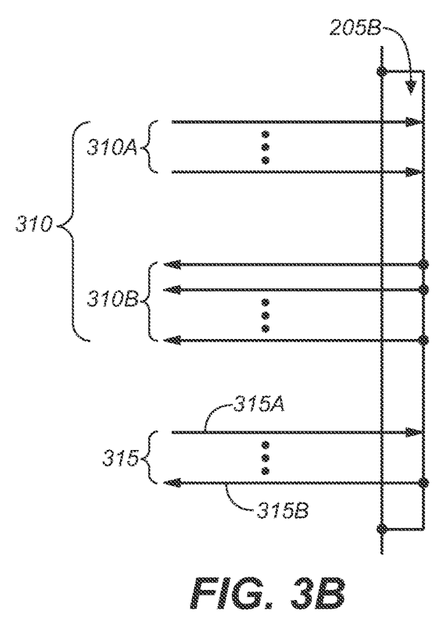

More audio channels are defined for the second audio interface 205B than are defined for the first audio interface 205A.

Referring now to FIG. 3B, a second plurality of audio channels 310 and at least one non-audio channel 315 are defined for the second audio interface 205B. The second plurality of audio channels 310 comprises at least two capture audio channels 310A and at least three render audio channels 310B. The at least one non-audio channel 315 comprises a first non-audio channel 315A, suitable for carrying data (i.e., not an audio signal) from the audio apparatus 120 to the computer apparatus 115, and a second non-audio channel 315B, suitable for carrying data from the computer apparatus 115 to the audio apparatus 120.

N.B. FIGS. 3A and 3B show unidirectional channels for convenience and simplicity of illustration; this should not be interpreted as imposing any limitation on the way the various channels may be implemented. For example, any of the illustrated unidirectional channels may be implemented as a bidirectional channel; also, any of the unidirectional channels may be combined with an opposite-direction unidirectional channel, to form a single bidirectional channel.

The audio application 200 is configured to cause the computer apparatus 115 to perform a novel method of switching from the first audio interface 205A to the second audio interface 205B. It is noted that the method is performed after the audio apparatus 120 has been connected to the computer apparatus 115 and, as a result of a conventional "plug-and-play" installation process, the audio apparatus 120 and the computer apparatus 115 are able to communicate via the first audio interface 205A.

Figure 4A:
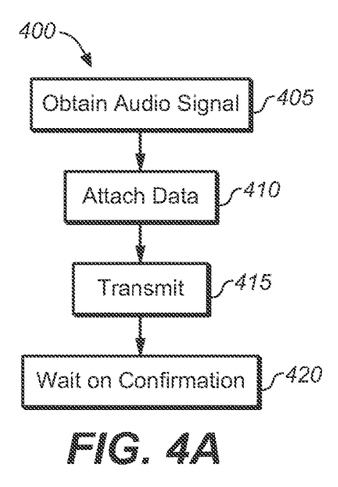
FIGS. 4A-C are schematic diagrams showing steps (FIG. 4A) and sub-steps (FIG. 4B) of a method, and associated signal flows (FIG. 4C), whereby the computer apparatus shown in FIGS. 1 and 2 requests a switch of interface between said computer apparatus and the audio apparatus of FIG. 1.
Figure 4B:
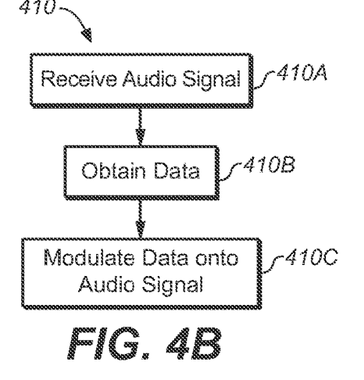
Figure 4C:
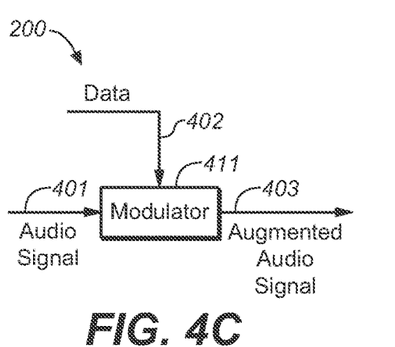

The novel method performed by the computer apparatus 115 will now be described with reference to FIGS. 4A-C.

In a first step 405 of the method 400, the computer apparatus 115 obtains an audio signal 401 for transmission to the audio apparatus 120. Obtaining the audio signal 401 may comprise retrieving a reference audio signal from memory. If the audio application 200 is or is part of a media player, then the audio signal 401 may obtained from a soundtrack of a movie which is currently being played, for example. If the audio application 200 is or is part of a telecommunications application, suitable for make VoIP calls, then the audio signal 401 may obtained from a "live" call, for example.

In a second step 410 of the method 400, the computer apparatus 115 combines data 402 with the audio signal 401, the data comprising a request to switch to the second audio interface 205B. The second step 410 comprises a plurality of sub-steps 410A-C, performed by a dedicated software module 411 of the audio application 200. In sub-steps 410A and 410B, the software module 411 receives the obtained audio signal 401 and obtains the data comprising the request, respectively. The obtaining (in sub-step 415B) of the data 402 may comprise retrieving the data 402 from a memory (not shown) of the computer apparatus 115. In sub-steps 410C, the software module 411 modulates the data 402 onto the audio signal 401 by means of conventional frequency modulation techniques, to thereby produce an augmented audio signal 403. Other suitable techniques for combining the data 402 with the audio signal 401, which fall within the scope of the accompanying claims, will be readily appreciated by those skilled in the art. For example, one of, or a suitable combination of, amplitude modulation, frequency modulation and phase modulation could be used to combine the data 402 with the audio signal 401. A perceptually low intrusive modulation scheme could be used. For instance, a spread spectrum (noise masked), wide band orthogonal frequency-division multiplexing (OFDM), hypersonic modulation, subsonic modulation, event based modulation or the like, all of which are known per se to the person of ordinary skill in the art and so need not be described in more detail here.

In a third step 415 of the method 400, the computer apparatus 115 transmits the augmented audio signal 403 to the audio apparatus 120 using the first audio interface 205A. In this embodiment, the computer apparatus 115 transmits the augmented audio signal 403 to the audio apparatus 120 using one (or, alternatively, both) of the render audio channels 300B.

In a fourth step 420 of the method 400, the computer apparatus 115 waits for a confirmation from the audio apparatus 120 that it has switched to the second audio interface. In this embodiment, the computer apparatus 115 waits for a given time period. The duration of the time period is a design parameter that may be selected by the person skilled in the art, based on preference. By way of example, the duration of the time period could be of the order of hundreds of microseconds, seconds or tens of seconds.

In a further, conditional step (not shown) of the method 400, the computer apparatus 115 determines to use the first audio interface 205A to communicate with the audio apparatus 120 if no confirmation from the audio apparatus 120 is received within the given period of time. Therefore, if the computer apparatus 115 is connected to a conventional audio apparatus which is not configured to use the second audio interface 205B, e.g. is not connected to the novel audio apparatus 120, it will not receive any response to the request to switch to the second audio interface 205B and so will (continue to) use the first audio interface 205A to communicate with the conventional audio apparatus. Thus the audio application 200 is compatible with conventional audio apparatus as well as the novel audio apparatus 120.

In an alternative, conditional step (not shown) of the method 400, the computer apparatus 115 determines to use the second audio interface 205B to communicate with the audio apparatus 120 after, and as a result of, receiving the confirmation from the audio apparatus 120. To carry out the receiving of the confirmation, the computer apparatus performs steps and sub-steps which are substantially the same, mutatis mutandis, as the first three steps and the attendant sub-steps of the method (600, in FIG. 6A) performed by the audio apparatus 120, which are described below with reference to FIGS. 6A-E.

The complementary method performed by the audio apparatus 120 will be described below, with reference to FIGS. 6A-E. First, a description of the audio apparatus 120 will be given with reference to FIG. 5.

Figure 5:
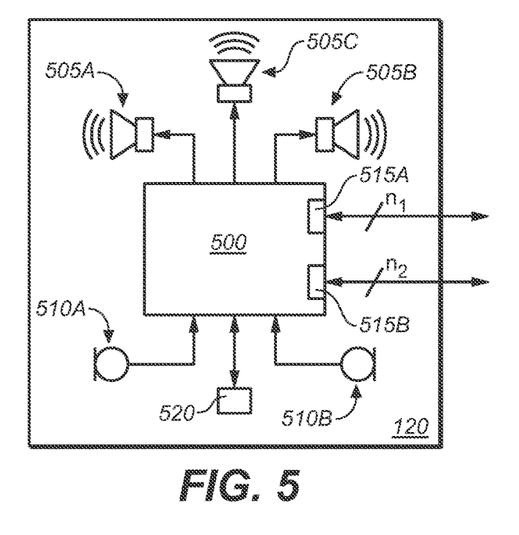
FIG. 5 is a schematic diagram showing some of the components of the audio apparatus (120) shown in FIG. 1.

In this embodiment, the audio apparatus 120 is a wearable headset. In other embodiments, the audio apparatus 120 may comprise a set of loudspeakers, in various arrangements. In other embodiments, the audio apparatus 120 may comprise an audio-rendering part of a display such as a computer monitor or television set.

As shown in FIG. 5, the audio apparatus 120 in this embodiment comprises a controller 500 and, connected to the controller 500, the following: a plurality of rendering acoustic transducers 505A-C connected to the controller 500; a plurality of capturing acoustic transducers 510A, B; and a sensor module 520.

The controller 500 comprises a conventional processor having a novel configuration due to novel software stored in memory (not shown) accessible by the processor. Optionally, the controller 500 may comprise dedicated digital signal processing circuitry, in the form of an application-specific chip, a field programmable gate array, a suitably programmed general purpose processor, or the like.

The controller 500 is configured to communicate with the computer apparatus 115 via a first audio interface 515A or via a second audio interface 515B.

The first audio interface 515A of the controller 500 is a conventional audio interface which is complementary to the first audio interface 205A of the computer apparatus 115. That is, the same channels are defined for the first audio interface 515A of the controller 500 as for the first audio interface 205A of the audio application 200, but of course any unidirectional channel will have opposite directions at the respective first audio interfaces 515A, 205A.

The second audio interface 515B of the controller 500 is a novel audio interface which is complementary to the second audio interface 205B of the computer apparatus 115. That is, the same channels are defined for the second audio interface 515B of the controller 500 as for the second audio interface 205B of the audio application 200, but of course any unidirectional channel will have opposite directions at the respective second audio interfaces 515B, 205B.

The plurality of rendering acoustic transducers 505A-C comprises a left-side loudspeaker 505A, a right-side loudspeaker 505B and a low-frequency acoustic transducer 505C, all of which are conventional.

The plurality of capturing acoustic transducers 510A, B comprises a first microphone 510A and a second microphone 510B. The first microphone 510A is suitable for capturing an audio signal representative mainly of speech from a user, and in this embodiment is a movable boom microphone. The second microphone 510B is suitable for capturing an audio signal representative mainly of ambient noise, and in this embodiment is a microphone fixed to a headband of the wearable headset.

The sensor module 520 comprises one or more sensors, e.g. an accelerometer, such as a 3-axis accelerometer; a magnetometer; a thermometer; a contact microphone, or more general forms of pressure or force sensing, light sensing or any physical sensor having some relevance to the use and application of the device; etc. The controller 500 is configured to use the first and second non-audio channels 315A, 315B to send non-audio data between the computer apparatus 115 and the sensor module 520.

The controller 500 is configured to cause the audio apparatus 120 to perform a novel method of switching from the first audio interface 515A to the second audio interface 515B. It is noted that the method is performed after the audio apparatus 120 has been connected to the computer apparatus 115 and, as a result of a conventional "plug-and-play" installation process, the audio apparatus 120 and the computer apparatus 115 are able to communicate via the first audio interface 205A. It is noted that the method is performed after the computer apparatus 115 has transmitted the request to the audio apparatus 120, in step 415 of the method 400.

The novel method 600 performed by the audio apparatus 120, which is complementary to the method 400 performed by the computer apparatus 115, will now be described with reference to FIGS. 6A-E.

Figure 6A:
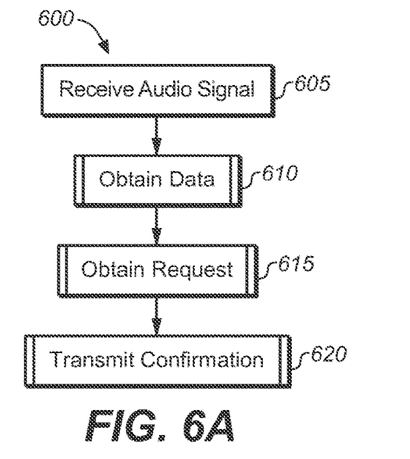
FIGS. 6A-E are schematic diagrams showing steps (FIG. 6A) and sub-steps (FIGS. 6B and D) of a method, and associated signal flows (FIGS. 6C and E), whereby the audio apparatus shown in FIGS. 1 and 5 responds to the request of FIGS. 4A-C.

In a first step 605 of the method 600, the audio apparatus 120 receives the augmented audio signal 403 from the computer apparatus 115, via the audio apparatus's first audio interface 515A.

In a second step 610 of the method 600, the audio apparatus 120 obtains the data 402 from the audio signal 403 (i.e., the data 402 which was combined with the audio signal 401 by the computer apparatus).

Figure 6B:
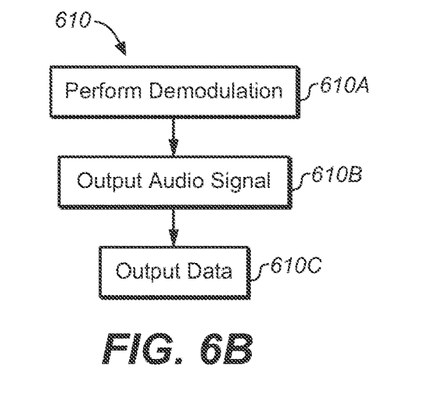
Figure 6C:
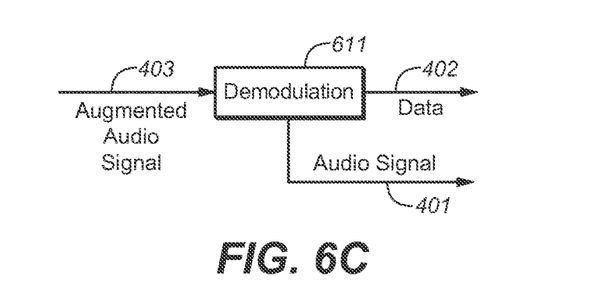

The second step 610 comprises a plurality of sub-steps 610A-C, performed by a data-obtainment module 611 (e.g., software running on the controller 500). In sub-steps 610A, the data-obtainment module 611 performs demodulation on the augmented audio signal 403; the demodulation is the inverse operation of the modulation performed at the computer apparatus 115 in step 410 (sub-step 410C). In sub-steps 610B, the data-obtainment module 611 outputs the audio signal 401, for subsequent rendering by at least one of the rendering acoustic transducers 505A-C. In sub-steps 610B, the data-obtainment module 611 outputs the data 402, for subsequent decoding.

Figure 6D:
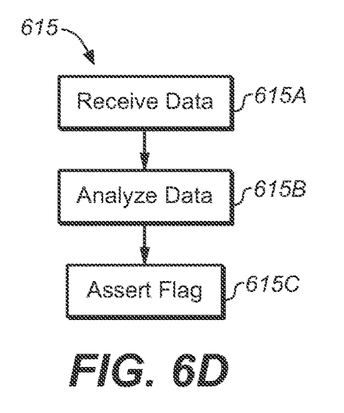
Figure 6E:
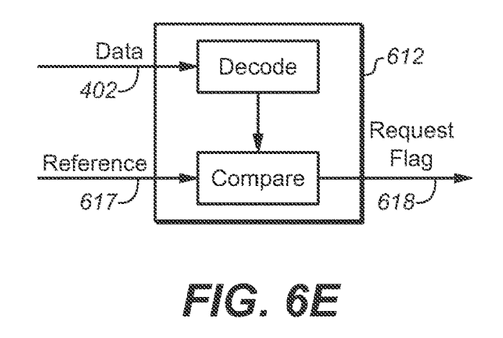

In a third step 615 of the method 600, the audio apparatus 120 obtains the request from the data 402 (i.e., the request to switch to the second audio interface). The third step 615 comprises a plurality of sub-steps 615A-C, performed by a request-obtainment module 612 (e.g., software running on the controller 500). In sub-steps 615A, the request-obtainment module 612 receives the data 402 from the data-obtainment module 611. In sub-steps 610B, the request-obtainment module 612 analyzes the data 402; if the data 402 is encoded, e.g. using error-correction coding, the request-obtainment module 612 performs decoding; the (decoded) data 402 is compared with reference data 617. In sub-steps 610C, as a consequence of the (decoded) data 402 matching the reference data 617, the request-obtainment module 612 asserts a request flag 618; the request flag 618 indicates that the computer apparatus has requested to switch to the second audio interface.

In a fourth step 620 of the method 600, and as a consequence of the request-obtainment module 612 asserting the request flag 618, the audio apparatus 120 transmits to the computer apparatus 115 a confirmation of switching to the second audio interface. To carry out the transmitting of the confirmation, the audio apparatus 120 performs steps and sub-steps which are substantially the same, mutatis mutandis, as the first three steps and the attendant sub-steps of the method 400 performed by the computer apparatus 115, as described above.

In a fifth step (not shown) of the method 600, and as a consequence of the request-obtainment module 612 asserting the request flag 618, the audio apparatus 120 determines to use the second audio interface to communicate with the computer apparatus after 115 and switches from a first mode of operation to a second mode of operation, the second mode of operation comprising additional functionality as compared with the first mode of operation, the additional functionality being unavailable via the first audio interface.

The audio apparatus 120 is configured to maintain the first mode of operation and to use the first audio interface 515A to communicate with the computer apparatus 115 unless and until the request flag 618 is asserted. Therefore, the audio apparatus 120 is compatible with conventional audio applications, albeit in a mode of operation comprising less functionality, as well as with the novel audio application 200.

The audio apparatus 120 is configured such that, by switching to its second mode of operation, and using the second audio interface, its additional functionality is revealed to the computer apparatus 115. The computer apparatus 115 (commanded by the audio application 200) is configured to use the second audio interface to access or control the additional functionality of the audio apparatus 120. For example, the different functionality may comprise access to and/or control of the sensor module 520.

The audio apparatus 120, in its second mode, is configured to receive non-audio data (e.g. from the sensor module 520) from the computer apparatus 115 via the first and second non-audio channels 315A, 315B.

In this embodiment, the second interface 205B "sits above" the first interface 205A, and acts as a kind of "wrapper". Thus the audio channels 300 of the first interface 205A carry the first and second non-audio channels 315A, 315B of the second interface 205B. In this regard, the controller 500 of the audio apparatus 120 is configured to generate purported audio data representative of received non-audio data it receives and to transmit the purported audio data over the audio channels 300 of the first interface 205A.

Generating the purported audio data may simply be a matter of arranging the received non-audio data in a format suitable for transmission over the audio channels 300. Then transmitting the purported audio data may involve time interleaving it with audio data representative of an audio signal captured by the first microphone 510A and/or audio data representative of an audio signal captured by the second microphone 510B. Or the purported audio data may be transmitted over its own audio channel, for example.

Generating the purported audio data may entail modulating the received non-audio data onto a carrier signal and representing the modulated carrier signal by the purported audio data. Then transmitting the purported audio data may involve by summing the purported audio data and (i) audio data representative of an audio signal captured by the first microphone 510A and/or (ii) audio data representative of an audio signal captured by the second microphone 510B.

As noted above, the computer apparatus 115, together with the audio apparatus 100, is configured to function as a (novel) telephone endpoint 105A in the teleconference system 100. The audio application 200 is, or is a part of, a teleconferencing application which enables the telephone-endpoint functionality on the computer apparatus 115. The teleconferencing application comprises, largely, conventional means for enabling a VoIP based teleconference or two-party call. However, during a teleconference or two-party call, the computer apparatus 115 (commanded by the audio application 200) is configured to use the second audio interface to obtain and render one or more audio signals of the teleconference or two-party call.

Figure 7A:
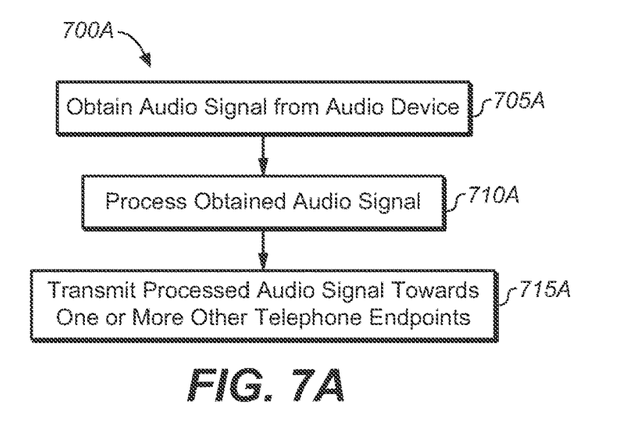
FIGS. 7A and B are schematic diagrams showing steps of a method whereby the computer apparatus shown in FIGS. 1 and 2 uses the audio apparatus shown in FIGS. 1 and 5 to capture and render, respectively, audio signals of a teleconference or two-party telephone call.

As shown in FIG. 7A, the computer apparatus 115 is configured to perform a method 700A whereby it uses the second audio interface to obtain, process and transmit an audio signal, from the audio apparatus 120, to one or more of other telephone endpoints 105B-E.

In a first step 705A of the method 700A, the computer apparatus 115 uses the second audio interface to obtain an audio signal captured by the first microphone 510A, via a first one of the capture audio channels 310A, as well as an audio signal captured by the second microphone 510B via a second one of the capture audio channels 310B. The audio signal captured by the first microphone 510A comprises an audio signal representative mainly of speech from a user. The audio signal captured by the second microphone 510B comprises an audio signal representative mainly of ambient noise.

In a second step 710A of the method 700A, the computer apparatus 115 processes the obtained audio signals, to produce a processed audio signal ready for transmission to the one or more other telephone endpoints 105B-E. For example, the computer apparatus 115 may use the audio signal representative mainly of ambient noise to perform noise suppression on the audio signal representative mainly of speech from the user. The computer apparatus 115 may combine the audio signal representative mainly of ambient noise and the audio signal representative mainly of speech, according to respective weighting values, so that the processed audio signal comprises a desired amount of ambient noise.

In a third step 715A of the method 700A, the computer apparatus 115 transmits the processed audio signal ready for transmission towards the one or more other telephone endpoints 105B-E. That is, the computer apparatus 115 transmits the processed audio signal to the network 110, to be forwarded to the one or more other telephone endpoints 105B-E.

Figure 7B:
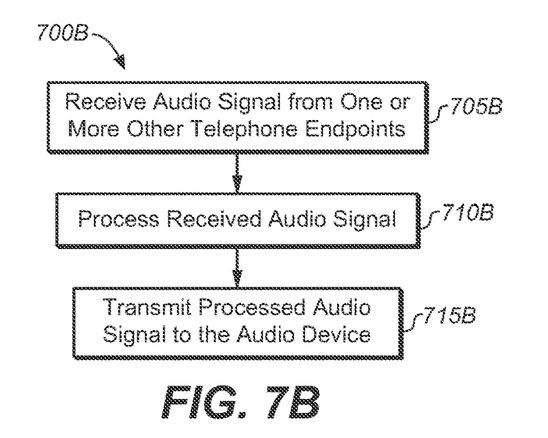

As shown in FIG. 7B, the computer apparatus 115 also is configured to perform a method 700B whereby it uses the second audio interface to separately render different audio signals via respective ones of the rendering acoustic transducers 505A-C.

In a first step 705B of the method 700B, the computer apparatus 115 an audio signal of a telephone conference or of a two-party telephone call, originating from one or more other telephone endpoints 105B-E.

In a second step 710B of the method 700B, the computer apparatus 115 processes the received audio signal for subsequent rendering by at least one of the rendering acoustic transducers 505A-C. For example, the computer apparatus 115 processes the received audio signal so as to produce a binaural left-speaker signal for rendering via the left-side loudspeaker 505A, a binaural right-speaker signal for rendering the right-side loudspeaker 505B and a bass signal for rendering via the low-frequency acoustic transducer 505C.

In a third step 715B of the method 700B, the computer apparatus 115 uses the second audio interface to transmit the audio signal(s) produced in step 710B to the audio apparatus 120 for rendering thereby. Respective audio signals may be sent via each of the at least three render audio channels 310B.

In various embodiment disclosed herein, by combining a request (to switch to a second audio interface) with an audio signal, and transmitting it via the first audio interface, the switch to the second audio interface, if it goes ahead, is separate from and subsequent to establishment of the first audio interface. Thus the switch, and indeed the second audio interface, can be defined in the application layer of the software stack (e.g., as a sort of "wrapper" around the first audio interface), while the first audio interface may be a "tried-and-tested" (standard) audio interface used to effect communication between the computer apparatus and the audio apparatus via the lower layers of the software stack. As a result, the second audio interface can be non-standard and can enable non-standard functionality, with the first audio interface being standard and thus providing a high degree of interoperability and ease of installation.

In various embodiments, the audio apparatus may be configured to use the second audio interface to communicate with the computer apparatus after, and as a result of, receiving the above-mentioned request. The audio apparatus may be configured to use the first audio interface unless and until it receives the above-mentioned request. Thus, to a conventional computer apparatus, the audio apparatus clamed herein will "appear to be" a standard audio apparatus using a standard audio interface. For example, the audio apparatus may be configured to switch from a first mode of operation to a second mode of operation, after, and as a result of, obtaining the above-mentioned request, the second mode of operation comprising additional functionality as compared with the first mode of operation. Thus, the computer apparatus claimed herein will have access to additional functionality of the audio apparatus, in a sort of "enhanced" mode.

The embodiments above have been provided by way of example. Various modifications to these embodiments, and numerous other embodiments, falling within the scope of the accompanying claims, will be readily appreciated by those skilled in the art.

For example, whereas the audio apparatus 120 was said to comprise a wearable headset, in other embodiments it may comprise a set of loudspeakers, e.g. six loudspeaker suitable for 5.1 channel surround sound playback; due to the second interface, the computer apparatus would have direct access to and control of all of the speakers.

For example, whereas the above methods 500, 600 (whereby the computer apparatus 115 and the audio apparatus 120 switch from the first interface to the second interface) used a simple exchange of request and acknowledgement, in other embodiments a more sophisticated handshake may be used. For instance, the audio apparatus may use public key cryptography, or other suitable techniques, to determine whether the computer apparatus is authorized to use the second mode of the audio apparatus, and may switch to the second audio interface only in response to verifying that the computer apparatus is authorized to use the second mode of the audio apparatus. For instance, the more sophisticated handshake may involve a discovery process whereby the computer apparatus learns about the capabilities of the audio apparatus. Then the computer apparatus may select, in dependence on the discovered capabilities of the audio apparatus, from a plurality of different second interfaces, the second interface to which the audio apparatus and the computer apparatus are to switch; in making the selection, the computer apparatus may refer to a look up table or database, stored on the computer apparatus or remotely, which associates audio-apparatus capabilities (and perhaps computer apparatus configurations) with respective preferred second interfaces.

For example, the computer apparatus and/or the audio apparatus may provide a visible and/or audible indication that the audio apparatus is entering the second mode. Such an indication may evoke a positive emotional response in a user of the computer apparatus and the audio apparatus.

The invention claimed is:

1. A computer apparatus configured to switch, when there exists a first audio interface between the computer apparatus and an audio apparatus, to using a second audio interface for communication between the computer apparatus and the audio apparatus, the second audio interface being different from the first audio interface, the audio apparatus including at least one acoustic actuator to render an audio signal received from the computer apparatus, by at least:

performing a discovery process by which the computer apparatus determines one or more capabilities of the audio apparatus;

selecting, based at least in part on the capabilities, the second audio interface;

obtaining audio data to be transmitted to the audio apparatus;

combining non-audio data with the audio data, the non-audio data comprising a request to switch to using the second audio interface;

transmitting the combined audio data and non-audio data to the audio apparatus using the first audio interface;

waiting for a confirmation from the audio apparatus that it has switched to using the second audio interface, wherein a first plurality of audio channels is defined for the first interface, the first plurality of audio channels including at least one microphone audio channel and at least one speaker audio channel.

2. The computer apparatus of claim 1, configured to combine the non-audio data with the audio data by modulating the non-audio data onto a carrier signal and adding the modulated carrier signal to the audio data.

3. The computer apparatus of claim 2, configured to use the second audio interface to communicate with the audio apparatus after, and as a result of, receiving the confirmation from the audio apparatus.

4. The computer apparatus of claim 3, configured to use the second audio interface to access or control additional functionality of the audio apparatus, the additional functionality being unavailable via the first audio interface.

5. The computer apparatus of claim 1, configured to use the first audio interface to communicate with the audio apparatus if the confirmation from the audio apparatus is not received within a given period of time.

6. The computer apparatus of claim 1, wherein more audio channels are defined for the second audio interface than are defined for the first audio interface.

7. An audio apparatus configured to switch, when there exists a first audio interface between the audio apparatus and a computer apparatus, to using a second audio interface for communication between the audio apparatus and the computer apparatus, the second audio interface being different from the first audio interface, the audio apparatus including at least one acoustic actuator to render an audio signal received from the computer apparatus, by at least:

providing the computer apparatus with audio apparatus capability information;

receiving, via the first audio interface, combined audio data and non-audio data, the non-audio data comprising a request to switch to using the second audio interface, the second audio interface corresponding with the audio apparatus capability information;

obtaining the request from the data; and in response to obtaining the request, transmitting to the computer apparatus a confirmation of switching to using the second audio interface, wherein a first plurality of audio channels is defined for the first interface, the first plurality of audio channels including at least one microphone audio channel and at least one speaker audio channel.

8. The audio apparatus of claim 7, configured to obtain the data by demodulation of a modulated carrier signal combined with the audio data.

9. The audio apparatus of claim 7, configured to send the confirmation by at least:

obtaining audio data to be transmitted to the computer apparatus;

combining non-audio data with the audio data, the non-audio data comprising the confirmation; and transmitting the combined audio data and non-audio data to the computer apparatus using the first audio interface.

10. The audio apparatus of claim 7, further configured to use the second audio interface to communicate with the computer apparatus after, and as a result of, obtaining the request.

11. The audio apparatus of claim 7, further configured switch from a first mode of operation to a second mode of operation, after, and as a result of, obtaining the request, the second mode of operation comprising additional functionality as compared with the first mode of operation.

12. The audio apparatus of claim 7, wherein two or more capture channels are defined for the second audio interface, wherein each of the capture channels is an audio channel for carrying audio data from the audio apparatus to the computer apparatus.

13. The audio apparatus of claim 12, comprising a first microphone and a second microphone, being further configured to:

transmit an audio signal captured by the first microphone to the computer apparatus via a first one of the capture channels; and transmit an audio signal captured by the second microphone to the computer apparatus via a second one of the capture channels.

14. The audio apparatus of claim 12, wherein the first one of the microphones is arranged to capture an audio signal representative mainly of a user's voice.

15. The audio apparatus of claim 12, wherein the second one of the microphones is arranged to capture an audio signal representative mainly of ambient noise.

16. The audio apparatus of claim 7, wherein three or more render channels are defined for the second audio interface, wherein each of the render channels is an audio channel for carrying audio data from the computer apparatus to the audio apparatus.

17. The audio apparatus of claim 16, comprising a first acoustic actuator, a second acoustic actuator and a third acoustic actuator, being further configured to:

use the first acoustic actuator to render an audio signal received from the computer apparatus via a first one of the render channels; and use the second acoustic actuator to render an audio signal received from the computer apparatus via a second one of the render channels; and use the third acoustic actuator to render an audio signal received from the computer apparatus via a third one of the render channels.

18. The audio apparatus of claim 17, wherein the first and second acoustic actuators are left and right loudspeakers, respectively.

19. The audio apparatus of claim 17, wherein the third acoustic actuators is configured to render a low frequency audio signal.

20. A non-transitory computer readable storage medium comprising software instructions which, when executed by one or more processors of a computer apparatus, or of an audio apparatus, cause the computer apparatus to be configured in accordance with claim 1.

* * * * *